United States Patent
Torsi et al.

(10) Patent No.: US 8,164,950 B2
(45) Date of Patent: *Apr. 24, 2012

(54) REDUCTION OF PUNCH-THROUGH DISTURB DURING PROGRAMMING OF A MEMORY DEVICE

(75) Inventors: Alessandro Torsi, Avezzano (IT); Carlo Musilli, Avezzano (IT); Seiichi Aritome, Zhudong Town (TW)

(73) Assignee: Micron Technology, Inc., Boise, ID (US)

( * ) Notice: Subject to any disclaimer, the term of this patent is extended or adjusted under 35 U.S.C. 154(b) by 99 days.

This patent is subject to a terminal disclaimer.

(21) Appl. No.: 12/778,524

(22) Filed: May 12, 2010

(65) Prior Publication Data

US 2011/0116311 A1 May 19, 2011

Related U.S. Application Data

(63) Continuation of application No. 12/047,841, filed on Mar. 13, 2008, now Pat. No. 7,733,705.

(51) Int. Cl.
G11C 16/04 (2006.01)

(52) U.S. Cl. ......... 365/185.02; 365/185.17; 365/185.18; 365/185.24

(58) Field of Classification Search ............. 365/185.28, 365/185.17, 185.24, 185.18
See application file for complete search history.

(56) References Cited

U.S. PATENT DOCUMENTS

| | | | |
|---|---|---|---|
| 5,257,225 A | 10/1993 | Lee | |
| 5,357,463 A | 10/1994 | Kinney | |
| 5,424,993 A | 6/1995 | Lee et al. | |
| 5,487,033 A * | 1/1996 | Keeney et al. | 365/185.19 |
| 5,511,022 A | 4/1996 | Yim et al. | |
| 5,528,547 A | 6/1996 | Aritome et al. | |
| 5,553,020 A * | 9/1996 | Keeney et al. | 365/185.19 |
| 5,621,684 A | 4/1997 | Jung | |
| 5,677,873 A | 10/1997 | Choi et al. | |
| 5,677,875 A | 10/1997 | Yamagata et al. | |
| 5,680,350 A | 10/1997 | Lee | |
| 5,715,194 A | 2/1998 | Hu | |
| 5,768,287 A | 6/1998 | Norman et al. | |
| 5,771,346 A | 6/1998 | Norman et al. | |
| 5,907,855 A | 5/1999 | Norman | |
| 5,917,757 A | 6/1999 | Lee et al. | |
| 5,920,501 A | 7/1999 | Norman | |
| 5,930,168 A | 7/1999 | Roohparvar | |
| 5,959,892 A | 9/1999 | Lin | |
| 5,991,202 A | 11/1999 | Derhacobian et al. | |

(Continued)

OTHER PUBLICATIONS

S. Satoh et al., A Novel Gate-Offset NAND Cell (GOC-NAND) Technology Suitable for High-Density and Low-Voltage-Operation Flash Memories, Microelectronics Engineering Laboratory, Japan, IEEE, 1999, 4 pgs.

(Continued)

*Primary Examiner* — Pho M Luu

(74) *Attorney, Agent, or Firm* — Leffert Jay & Polglaze, P.A.

(57) ABSTRACT

A punch-through disturb effect in a memory device can be reduced by biasing a selected word line at a program voltage to program a selected memory cell, biasing word lines on the drain side of the series string with a $V_{pass}$ voltage, turning off an adjacent memory cell to the selected memory cell, and biasing remaining word lines on the source side of the turned-off memory cell with a $V_{low}$ voltage that is less than $V_{pass}$.

22 Claims, 4 Drawing Sheets

U.S. PATENT DOCUMENTS

| | | | |
|---|---|---|---|
| 6,061,270 | A | 5/2000 | Choi |
| 6,107,658 | A | 8/2000 | Itoh et al. |
| 6,157,575 | A | 12/2000 | Choi |
| 6,163,048 | A | 12/2000 | Hirose et al. |
| 6,240,016 | B1 | 5/2001 | Haddad |
| 6,240,023 | B1 | 5/2001 | Roohparvar |
| 6,370,062 | B2 | 4/2002 | Choi |
| 6,380,033 | B1 | 4/2002 | He et al. |
| 6,469,933 | B2 | 10/2002 | Choi et al. |
| 6,487,117 | B1 | 11/2002 | Choi et al. |
| 6,493,270 | B2 | 12/2002 | Chevallier |
| 6,498,752 | B1 | 12/2002 | Hsu et al. |
| 6,519,181 | B2 | 2/2003 | Jeong |
| 6,522,584 | B1 | 2/2003 | Chen et al. |
| 6,620,682 | B1 | 9/2003 | Lee |
| 6,657,915 | B2 | 12/2003 | Seo |
| 6,660,585 | B1 | 12/2003 | Lee et al. |
| 6,661,707 | B2 | 12/2003 | Choi et al. |
| 6,707,714 | B2 | 3/2004 | Kawamura |
| 6,798,694 | B2 | 9/2004 | Mihnea et al. |
| 6,925,011 | B2 | 8/2005 | Pekny et al. |
| 6,975,537 | B2 | 12/2005 | Lutze et al. |
| 6,977,842 | B2 | 12/2005 | Nazarian |
| 6,982,905 | B2 | 1/2006 | Nguyen |
| 7,020,017 | B2 | 3/2006 | Chen et al. |
| 7,020,026 | B2 * | 3/2006 | Guterman et al. ....... 365/185.28 |
| 7,099,193 | B2 | 8/2006 | Futatsuyama |
| 7,120,059 | B2 | 10/2006 | Yeh |
| 7,161,833 | B2 | 1/2007 | Hemink |
| 7,212,435 | B2 | 5/2007 | Rudeck et |
| 7,245,534 | B2 | 7/2007 | Goda et al. |
| 7,292,476 | B2 | 11/2007 | Goda et al. |
| 7,355,889 | B2 | 4/2008 | Hemink et al. |
| 7,394,693 | B2 | 7/2008 | Aritome |
| 7,408,810 | B2 | 8/2008 | Aritome et al. |
| 7,440,321 | B2 | 10/2008 | Aritome |
| 7,471,565 | B2 | 12/2008 | Aritome |
| 7,474,560 | B2 | 1/2009 | Aritome |
| 7,499,330 | B2 | 3/2009 | Goda et al. |
| 7,505,322 | B2 | 3/2009 | Lee |
| 7,561,469 | B2 | 7/2009 | Aritome |
| 7,570,513 | B2 | 8/2009 | Li et al. |
| 7,719,895 | B2 * | 5/2010 | Kucic ....................... 365/185.18 |
| 7,733,705 | B2 * | 6/2010 | Torsi et al. ............... 365/185.28 |
| 2002/0060926 | A1 | 5/2002 | Choi |
| 2002/0075727 | A1 | 6/2002 | Jeong et al. |
| 2002/0149958 | A1 | 10/2002 | Kunikiyo |
| 2004/0080980 | A1 | 4/2004 | Lee |
| 2004/0152262 | A1 | 8/2004 | Ichige et al. |
| 2004/0237000 | A1 | 11/2004 | Keays |
| 2005/0088890 | A1 | 4/2005 | Matsunaga et al. |
| 2005/0226055 | A1 | 10/2005 | Guterman |
| 2005/0265097 | A1 | 12/2005 | Tanaka et al. |
| 2006/0002167 | A1 | 1/2006 | Rudeck et al. |
| 2006/0023502 | A1 | 2/2006 | Cernea et al. |
| 2006/0274583 | A1 | 12/2006 | Lutze |
| 2007/0047314 | A1 | 3/2007 | Goda et al. |
| 2007/0177429 | A1 | 8/2007 | Nagashima et al. |
| 2007/0236992 | A1 | 10/2007 | Oowada |
| 2007/0258286 | A1 | 11/2007 | Higashitani |
| 2008/0101126 | A1 | 5/2008 | Hemink |
| 2008/0253187 | A1 | 10/2008 | Aritome |
| 2008/0316827 | A1 | 12/2008 | Higashitani |
| 2009/0189211 | A1 | 7/2009 | Orimoto et al. |

OTHER PUBLICATIONS

Satoh et al., A Novel Isolation-Scaling Technology for NAND EEPROMs with the Minimized Program Disturbance, Microelectronics Engineering Laboratory, Japan, IEEE, 1997, IEDM 97-291, pp. 11.6.1-11.6.4.

Jung et al., "A 117-mm2 3.3-V Only 128-Mb Multilevel NAND Flash Memory for Mass Storage Applications" IEEE Journal of Solid-State Circuits, IEEE Inc., New York, NY, U.S., vol. 31, No. 11, Nov. 1996, pp. 1575-1583.

K. Suh et al., "A 3.3 V 32 Mb NAND Flash Memory with Incremental Step Pulse Programming Scheme" IEEE Journal of Solid-State Circuits, IEEE Inc., New York, NY, vol. 30, No. 11, Nov. 1995, pp. 1149-1156.

* cited by examiner

REDUCTION OF PUNCH-THROUGH DISTURB DURING PROGRAMMING OF A MEMORY DEVICE

RELATED APPLICATIONS

This application is a Continuation of U.S. application Ser. No. 12/047,841, now U.S. Pat. No. 7,733,705 titled "REDUCTION OF PUNCH-THROUGH DISTURB DURING PROGRAMMING OF A MEMORY DEVICE", filed Mar. 13, 2008, which is commonly assigned and incorporated herein by reference.

TECHNICAL FIELD

The present disclosure relates generally to semiconductor memory and more particularly to non-volatile memory devices.

BACKGROUND

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes such as floating gates or trapping layers or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Two common types of flash memory array architectures are the "NOR" and "NAND" architectures. These architectures are named for the resemblance that the basic memory cell configuration of each architecture has to a basic NOR or NAND gate circuit, respectively.

In the conventional NOR array architecture, floating gate memory cells of the memory array are arranged in a matrix. The gates of each floating gate memory cell of the array matrix are connected by select lines, conventionally referred to as "word lines", and their drains are connected to transfer lines that are conventionally referred to as bit or digit lines. Memory cells having their control gates connected to a common select line are considered to be a "row" of memory cells while memory cells having their drains connected to a common transfer line are considered to be a "column" of memory cells. The source of each floating gate memory cell is typically connected to a common source line. The NOR architecture floating gate memory array is accessed by a row decoder activating a row of floating gate memory cells by selecting the word line connected to their control gates. The row of selected memory cells then place their stored data values on the bit lines by flowing a differing current if in a programmed state or not programmed state from the connected source line to the connected bit line.

A NAND architecture arranges its array of non-volatile memory cells in a matrix of rows and columns so that the gates of each non-volatile memory cell of the array are coupled by rows to word lines. However, unlike NOR, each memory cell is not directly coupled to a source line and a bit line. Instead, the memory cells of the array are arranged together in strings, typically of 8, 16, 32, or more each, where the memory cells in the string are coupled together in series, source to drain, between a common source line and a column bit line. It is noted that other non-volatile memory array architectures exist, including, but not limited to AND arrays, OR arrays, and virtual ground arrays.

One problem with programming in a NAND memory array is program disturb. Program disturb refers to the increase of the threshold voltages of memory cells in a bit line and/or a word line containing a memory cell being programmed. The threshold voltage increase is a result of the programming voltage that is applied to the cell being programmed affecting other cells coupled to the bit line/word line as well. Program disturb can result in an unprogrammed cell being programmed or a programmed cell changing states.

One method used to reduce program disturb is a boosting scheme that biases unselected word lines with a program inhibit voltage. For example, the unselected word lines in a NAND series string of memory cells can be biased with 10V. The unselected word lines couple to unselected bit lines causing a voltage to exist in the channel of the unselected bit lines. This tends to reduce the disturb condition.

A problem with this scheme is that punch-through can occur on nearby word lines in the same series string if these cells are turned off. The effect of punch-through is to increase the threshold voltage for the cells coupled to the affected word lines. Typically punch-through has the greatest affect on the source-side word lines of the selected word line.

For the reasons stated above, and for other reasons which will become apparent to those skilled in the art upon reading and understanding the present specification, there is a need in the art for reducing a punch-through disturb effect in a memory device.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Figure 1:
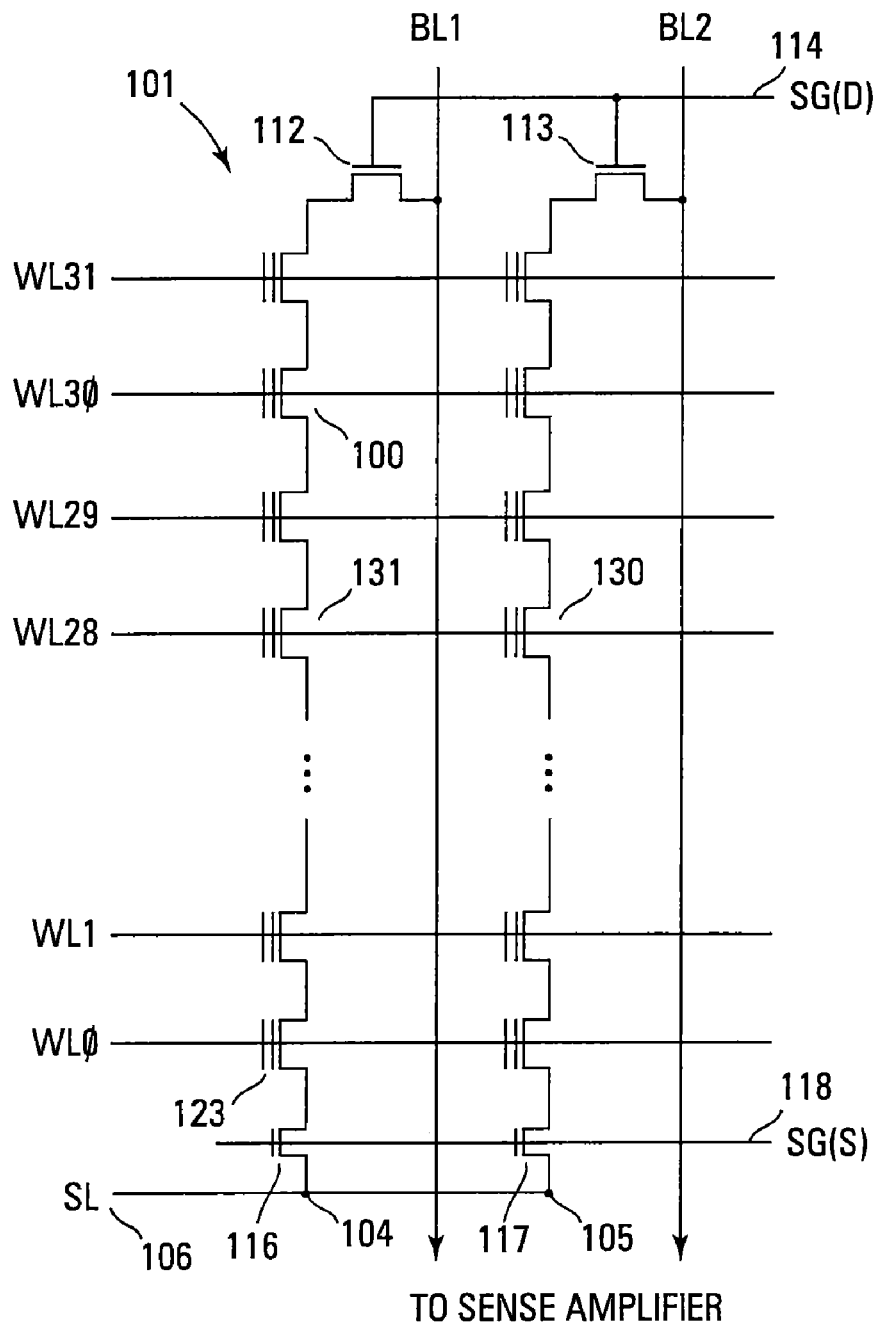
FIG. 1 shows a schematic diagram of one embodiment of a portion of a memory array.

FIG. 1 illustrates a schematic diagram of a portion of a NAND architecture memory array comprising series strings of non-volatile memory cells. The array comprises an array of non-volatile memory cells 101 (e.g., floating gate) arranged in series strings 104, 105 that can also be referred to as columns. Each of the cells 101 are connected drain to source in each series string 104, 105. A word line WL0-WL31 that spans across multiple series strings 104, 105 is connected to the control gates of each memory cell in a row in order to provide different biasing levels to each memory cell to enable different operations (i.e., program, read, erase) in response to a connected bit line. The bit lines BL1, BL2 are connected to sense amplifiers (not shown) that detect the state of each cell by sensing current on a particular bit line.

Select lines, such as word lines WL0-WL31, select the individual memory cells in the series strings 104, 105 to be written to (i.e., programmed) or read from and operate the remaining memory cells in each series string 104, 105 in a pass through mode. Each series string 104, 105 of memory cells is coupled to a source line 106 by a source select gate 116, 117 and to an individual bit line BL1, BL2 by a drain select gate 112, 113. The source select gates 116, 117 are controlled by a source select gate control line SG(S) 118 connected to their control gates. The drain select gates 112, 113 are controlled by a drain select gate control line SG(D) 114.

Each memory cell can be programmed as a single level cell (SLC) or multilevel cell (MLC). Each cell's threshold voltage ($V_t$) is indicative of the data that is stored in the cell. For example, in an SLC, a $V_t$ of 0.5V might indicate a programmed cell while a $V_t$ of −0.5V might indicate an erased cell. The MLC may have multiple $V_t$ windows (i.e., range of $V_t$ voltages) that each indicate a different state. Multilevel cells take advantage of the analog nature of a traditional flash cell by assigning, for example, a bit pattern to a specific voltage range stored on the cell. This technology permits the storage of two or more bits per cell, depending on the quantity of voltage ranges assigned to the cell.

Figure 2:
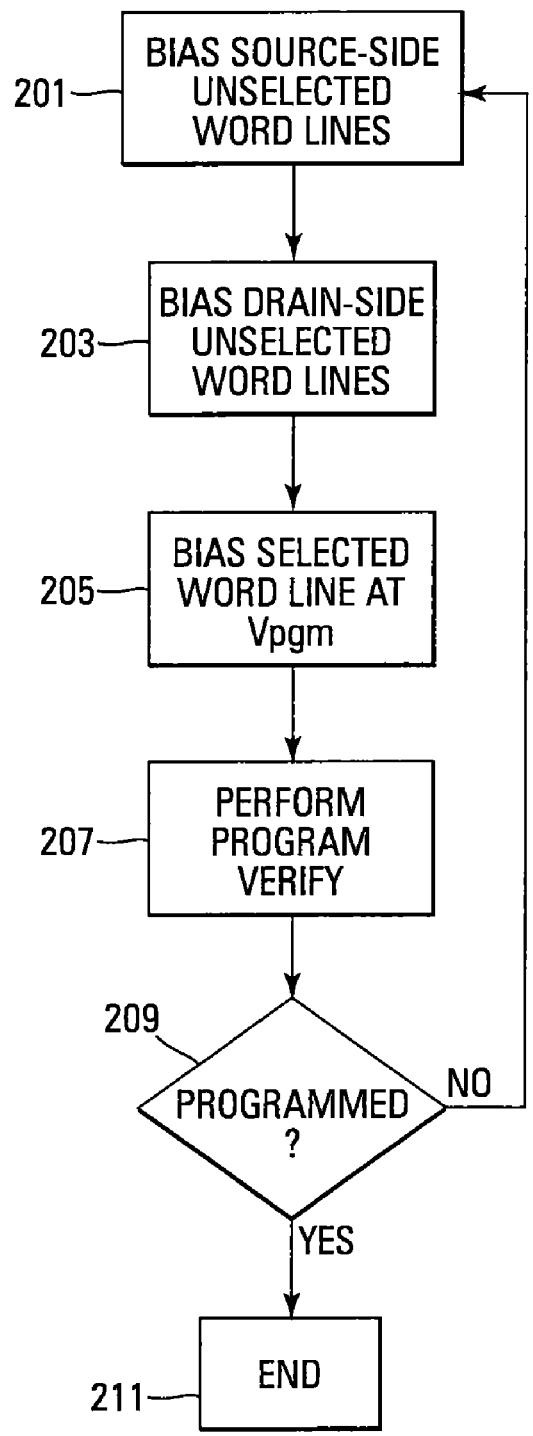
FIG. 2 shows a flowchart of one embodiment of a method for programming that incorporates a self-boosting method in a memory device.

FIG. 2 illustrates a flowchart of one embodiment of a method for programming a memory device that incorporates a self-boosting method. The programming is typically performed on a per memory block (i.e., a group of a predetermined quantity of memory cells) basis but the present embodiments are not limited to any one programming scheme. The biasing steps are not required to be performed in any particular order for proper operation of the disclosed method.

The source-side unselected word lines are biased 201 according to one of the four embodiments shown in the following table. Similarly, the drain-side unselected word lines are also biased 203 according to the following table. The selected word line comprising the memory cells to be programmed is biased at $V_{pgm}$ 205.

The table shows that at least one word line on the source-side of the selected word line (i.e., WLN) is biased at ground potential. The ground potential turns off the memory cells coupled to that word line. Additionally, a memory cell is off whenever the $V_t$ of the cell is greater than 0. If the $V_t$ of the cell is negative, the cell is not off and punch-through is not a problem. The word lines on the source-side of the "turned-off" word line are biased at $V_{low}$. The $V_{low}$ bias reduces the potential difference across the turned off word line, thus reducing the punch-through disturb effect.

To improve the self-boost to the selected cell on the selected word line (WLN) and reduce the punch-through effect further, the memory cell on the adjacent series string, that is adjacent to the "turned-off" cell on the selected series string, should also be turned-off. As an example of operation of embodiment 2 of the table, referring again to FIG. 1, WL30 is assumed to be equivalent to WLN. The memory cell 100 coupled to BL1 is the selected cell 100. Thus, according to embodiment 2 of the table, WL30 would be biased at Vpgm, WL29 (i.e., WL(N−1)) would be biased at biasL, WL28 (i.e., WL(N−2)) would be biased at GND, and the remaining word lines of BL1 would be biased at $V_{low}$. BL1 would be biased at 0V to enable the bit line for programming and BL2 would be biased at $V_{CC}$ in order to inhibit the adjacent bit line and to turn off the memory cell 130 adjacent to the turned-off cell 131 of BL1. WL31 would be biased at $V_{pass}$.

In one embodiment, the programming voltage, $V_{pgm}$, is a series of incrementally increasing programming pulses. For example, if the first programming pulse does not program the memory cell or cells to the target threshold voltage, $V_{pgm}$ is increased by a step voltage (e.g., 1V) and the new programming pulse is applied to the selected word line again. The incrementing is repeated until the memory cell is programmed to the target threshold voltage.

The bit lines of the memory block being programmed are also biased in an enable/inhibit manner. The bit lines coupled to the cells to be programmed are typically biased at 0V while the inhibited bit lines are typically biased at $V_{CC}$.

Referring again to FIG. 2, a program verify operation is then performed 207 to determine if the cell or cells to be programmed have reached the target threshold voltage. The program verify comprises biasing the selected word line containing the cell to be verified with a verify voltage. A typical verify voltage can be 0.5V. The remaining unselected word lines can be biased with a pass voltage of approximately 5.8V during the verify operation. Additionally, the bit line is also

|   | WL0 | ... | WL(N − 4) | WL(N − 3) | WL(N − 2) | WL(N − 1) | WLN | WL(N + 1) | ... | WL31 |
|---|---|---|---|---|---|---|---|---|---|---|
| 1 | $V_{low}$ |  | $V_{low}$ | $V_{low}$ | $V_{low}$ | GND | $V_{pgm}$ | $V_{pass}$ |  | $V_{pass}$ |
| 2 | $V_{low}$ |  | $V_{low}$ | $V_{low}$ | GND | biasL | $V_{pgm}$ | $V_{pass}$ |  | $V_{pass}$ |
| 3 | $V_{low}$ |  | $V_{low}$ | GND | biasL | $V_{pass}$ | $V_{pgm}$ | $V_{pass}$ |  | $V_{pass}$ |
| 4 | $V_{low}$ |  | $V_{low}$ | $V_{low}$ | GND | biasL | $V_{pgm}$ | biasH |  | $V_{pass}$ |

Approximate voltage ranges for the biasing of the self-boosting schemes illustrated in the table include $V_{low}$ having a range of 0V to 6V, $V_{pass}$ having a range of 9V to 10V, $V_{pgm}$ having a range of 15V to 23V, both "biasL" and "biasH" are typically about equal and range between $V_{low}$ and $V_{pass}$ (i.e., 6V to 10V). Both "biasL" and "biasH" are voltages that improve self-boost where "biasH" is used on the drain-side of the series string and "biasL" is used on the source-side of the series string. These voltage ranges are for purposes of illustration only as the present embodiments are not limited to any particular voltage ranges.

biased so that it is enabled for verification. The select gate source and select gate drain transistors are biased so that they are turned on to allow the selected series string to conduct to the bit line.

If the verification operation determines that the memory cell is not programmed 209, the above programming method with self-boost is repeated. If the memory cell is verified to the target threshold voltage 209, the programming method is complete 211.

Figure 3:
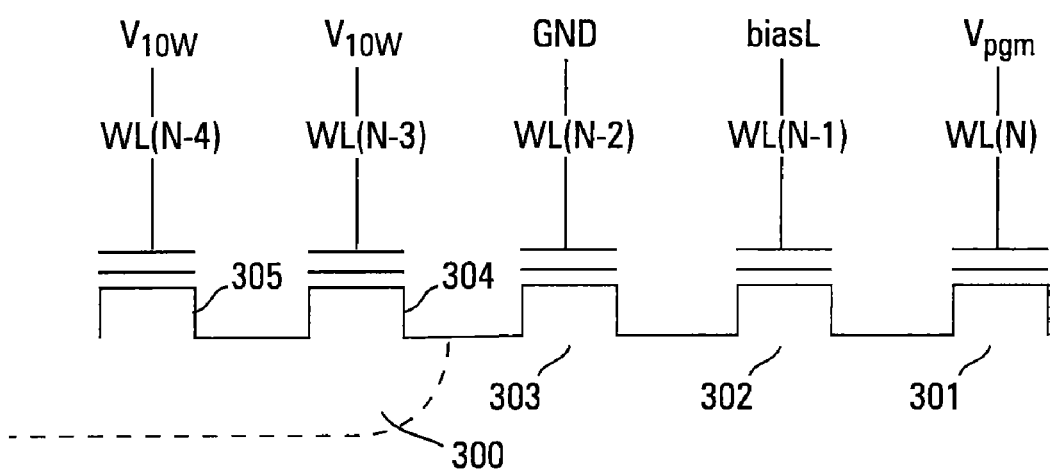
FIG. 3 shows one embodiment of a cross-sectional view of a series string of memory cells in accordance with the method for programming of FIG. 2.

FIG. 3 illustrates a cross-sectional view of one embodiment of a portion of one series string in accordance with the memory array portion of FIG. 1 and the programming method of FIG. 2. This figure again assumes that embodiment 2 of the above table is used.

The selected cell 301 is shown coupled to WLN and biased at Vpgm. The adjacent cell 302 in the same series string is coupled to WL(N−1) that is biased at biasL. The next cell 303 in the same series string is coupled to WL(N−2) that is biased at ground potential. This cell 303 is thus turned off. The next two cells 304, 305 are coupled to WL(N−3) and WL(N−4), respectively. These word lines are biased at $V_{low}$ in order to generate an area of lower self-boost 300 that reduces the punch-through effect by reducing the voltage drop across the turned-off cell 303.

Figure 4:
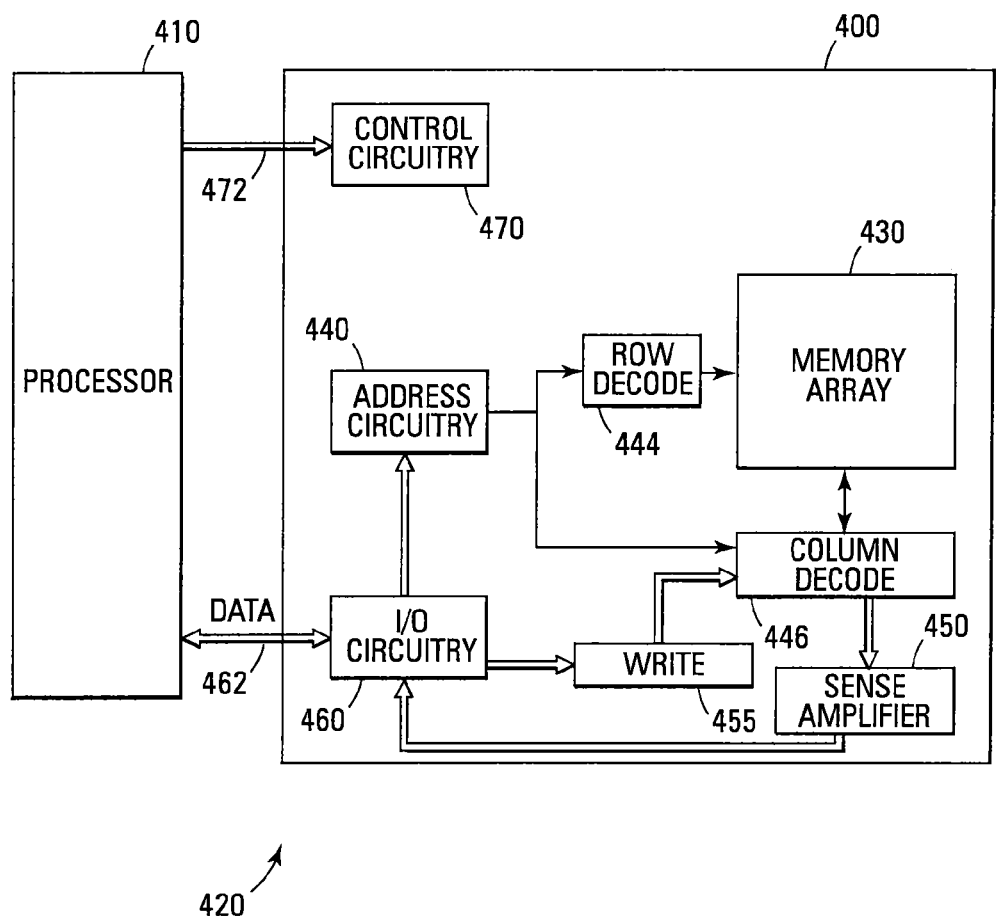
FIG. 4 shows a block diagram of one embodiment of a memory system that incorporates the back pattern compensation of the present disclosure.

FIG. 4 illustrates a functional block diagram of a memory device 400. The memory device 400 is coupled to a processor 410. The processor 410 may be a microprocessor or some other type of controlling circuitry. The memory device 400 and the processor 410 form part of a memory system 420. The memory device 400 has been simplified to focus on features of the memory that are helpful in understanding the present embodiments.

The memory device includes an array of flash memory cells 430 or some other type of non-volatile memory cells. The memory array 430 is arranged in banks of rows and columns. The control gates of each row of memory cells is coupled with a word line while the drain and source connections of the memory cells are coupled to bit lines. As is well known in the art, the connection of the cells to the bit lines depends on whether the array is a NAND architecture, a NOR architecture, an AND architecture, or some other array architecture.

An address buffer circuit 440 is provided to latch address signals provided through I/O circuitry 460. Address signals are received and decoded by a row decoder 444 and a column decoder 446 to access the memory array 430. It will be appreciated by those skilled in the art, with the benefit of the present description, that the number of address input connections depends on the density and architecture of the memory array 430. That is, the number of addresses increases with both increased memory cell counts and increased bank and block counts.

The memory device 400 reads data in the memory array 430 by sensing voltage or current changes in the memory array columns using sense amplifier/buffer circuitry 450. The sense amplifier/buffer circuitry 450, in one embodiment, is coupled to read and latch a row of data from the memory array 430. Data input and output buffer circuitry 460 is included for bi directional data communication, as well as address input, over a plurality of data connections 462 with the processor 410. Write circuitry 455 is provided to write data to the memory array.

Control circuitry 470 decodes signals provided on control connections 472 from the processor 410. These signals are used to control the operations on the memory array 430, including data read, data write, and erase operations. The control circuitry 470 may be a state machine, a sequencer, or some other type of controller. The control circuitry 470 is adapted to execute the embodiments of the programming operation with self-boost as discussed previously.

The non-volatile memory device illustrated in FIG. 4 has been simplified to facilitate a basic understanding of the features of the memory and is for purposes of illustration only. A more detailed understanding of internal circuitry and functions of non-volatile memories are known to those skilled in the art.

CONCLUSION

One or more embodiments of the present disclosure provide a reduction in punch-through disturb effect. By reducing the word line bias voltage on the unselected word lines on the source-side of a turned-off word line, the voltage drop across the turned-off word line is reduced. The word lines between the turned-off word line and the selected word line are biased at a voltage between $V_{low}$ and $V_{pass}$.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of programming a selected memory cell, the method comprising:
   biasing a control gate of the selected memory cell with a program voltage;
   biasing a control gate of an unselected memory cell, on a drain-side of the selected memory cell, with a pass voltage; and
   biasing a control gate of an unselected memory cell, on a source-side of the selected memory cell, with a voltage ($V_{low}$) that is less than the pass voltage and greater than ground potential.

2. The method of claim 1 and further including biasing a control gate of an unselected memory cell adjacent to the selected memory cell, on the source side of the selected memory cell, with a voltage (biasL) that is less than the pass voltage and greater than the $V_{low}$ voltage.

3. The method of claim 2 and further including biasing a control gate of an unselected memory cell adjacent to and on the source-side of the unselected memory cell biased with the biasL voltage at ground potential.

4. The method of claim 3 and further including biasing a control gate of an unselected memory cell, adjacent to the selected memory cell on the drain side of the selected memory cell, with a biasH voltage that is greater than $V_{low}$ and less than the pass voltage.

5. The method of claim 1 and further including biasing a control gate of an unselected memory cell adjacent to the selected memory cell, on the source side of the selected memory cell, with the pass voltage.

6. The method of claim 5 and further including biasing a control gate of an unselected memory cell, adjacent to the unselected memory cell biased with the pass voltage on the source-side, with a voltage (biasL) that is less than the pass voltage and greater than the $V_{low}$ voltage.

7. The method of claim 6 and further including biasing a control gate of an unselected memory cell, adjacent to the unselected memory cell biased with the biasL voltage, at ground potential.

8. The method of claim 1 and further including biasing a control gate of an unselected memory cell, adjacent to the selected memory cell on the source side of the selected memory cell, with ground potential.

9. A method for reducing punch-through effect during programming of a plurality of memory cells in a memory device, the method comprising:
   biasing a control gate of a selected memory cell with at least one programming pulse at an initial programming voltage;
   biasing, with a first voltage, a control gate of a first unselected memory cell on a drain-side of and adjacent to the selected memory cell and a second unselected memory cell on a source-side of and adjacent to the selected memory cell;

biasing control gates of remaining unselected memory cells on the drain-side of the selected memory cell at $V_{pass}$, where $V_{pass}$ is greater than the first voltage;

biasing a control gate of a third unselected memory cell, adjacent to the second adjacent memory cell, at ground potential; and biasing control gates of remaining unselected memory cells on the source-side of the third unselected memory cell at $V_{low}$, where $V_{low}$ is less than both $V_{pass}$ and the first voltage.

10. The method of claim 9 and further including biasing the selected memory cell with additional programming pulses if a memory cell being programmed does not reach a target threshold voltage wherein the additional programming pulses are each incremented by a step voltage prior to biasing.

11. The method of claim 9 wherein the first voltage is in a range of 6V to 10V.

12. A method for reducing punch-through effect during programming of a memory block in a non-volatile memory device, the method comprising:

biasing a selected memory cell of a series string of memory cells with at least one programming pulse at an initial programming voltage;

biasing, with a first voltage, a first unselected memory cell on a source-side of and adjacent to the selected memory cell;

biasing unselected memory cells on the drain-side of the selected memory cell at $V_{pass}$, where $V_{pass}$ is greater than the first voltage;

biasing a second unselected memory cell, adjacent to the first adjacent memory cell, at ground potential; and biasing remaining unselected memory cells on the source-side of the second unselected memory cell at $V_{low}$, where $V_{low}$ is less than both $V_{pass}$ and the first voltage.

13. The method of claim 12 wherein $V_{pass}$ is less than 10V.

14. The method of claim 12 wherein the series string of memory cells is a NAND architecture series string coupled source to drain.

15. A method for reducing punch-through effect during programming of a memory block in a non-volatile memory device, the method comprising:

biasing a selected memory cell of a series string of memory cells with a programming pulse at a programming voltage;

biasing, at a $V_{pass}$ voltage, a first unselected memory cell on a source-side of and adjacent to the selected memory cell;

biasing unselected memory cells on the drain-side of the selected memory cell at the $V_{pass}$ voltage;

biasing, at a first voltage that is less than the $V_{pass}$ voltage, a second unselected memory cell on the source-side of and adjacent to the first unselected memory cell;

biasing, at ground potential, a third unselected memory cell, adjacent to and on the source-side of the second unselected memory cell; and biasing, at $V_{low}$, remaining unselected memory cells on the source-side of the third unselected memory cell, where $V_{low}$ is less than both $V_{pass}$ and the first voltage.

16. The method of claim 15 wherein $V_{low}$ is less than $V_{pass}$ and $V_{pass}$ is less than 10V.

17. The method of claim 15 and further including determining if a threshold voltage of a selected memory cell has reached a target threshold voltage.

18. A memory device comprising:

an array of memory cells; and control circuitry coupled to the array of memory cells and configured to bias a control gate of a selected memory cell of the array of memory cells a program voltage, bias control gates of unselected memory cells on a drain-side of the selected memory cell with a pass voltage, and bias control gates of unselected memory cells on a source-side of the selected memory cell with a voltage that is less than the pass voltage.

19. The memory device of claim 18 wherein the non-volatile memory device is a NAND flash memory device.

20. The memory device of claim 18 wherein the control circuitry is further configured to bias an adjacent memory cell on the source-side of the selected memory cell at ground potential.

21. The memory device of claim 18 wherein the control circuitry is further configured to control bias of the selected memory cell with a series of incrementally increasing programming pulses in response to results of a program verification operation.

22. The memory device of claim 18 wherein the control circuitry is further configured to turn off an adjacent memory cell to the target memory cell and bias remaining unselected memory cells on the source side of the adjacent memory cell with the voltage that is less than the pass voltage.

* * * * *